(12) United States Patent  
Tani et al.

(10) Patent No.: US 8,487,439 B2
(45) Date of Patent: Jul. 16, 2013

(54) LAMINATED AND SINTERED CERAMIC CIRCUIT BOARD, AND SEMICONDUCTOR PACKAGE INCLUDING THE CIRCUIT BOARD

(75) Inventors: Makoto Tani, Inazawa (JP); Takami Hirai, Toyota (JP); Shinsuke Yano, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 22 days.

(21) Appl. No.: 13/237,259

(22) Filed: Sep. 20, 2011

(65) Prior Publication Data

US 2013/0026636 A1   Jan. 31, 2013

Related U.S. Application Data

(63) Continuation of application No. PCT/JP2011/067519, filed on Jul. 29, 2011.

(51) Int. Cl.
*H01L 23/48* (2006.01)
*H01L 23/52* (2006.01)
*H01L 23/40* (2006.01)

(52) U.S. Cl.
USPC ........... 257/762; 257/700; 257/703; 257/741; 257/750; 257/758; 438/618; 438/622; 438/624; 438/625; 438/629; 438/666; 438/668

(58) Field of Classification Search
USPC ................. 257/700, 703, 758; 438/618, 622, 438/624, 625, 629
See application file for complete search history.

(56) References Cited

U.S. PATENT DOCUMENTS

| 5,488,542 | A  | * | 1/1996  | Ito .................................. 361/793 |
| 5,939,789 | A  | * | 8/1999  | Kawai et al. .................. 257/758 |
| 6,211,062 | B1 | * | 4/2001  | Oda ............................... 438/623 |
| 6,262,487 | B1 | * | 7/2001  | Igarashi et al. ............... 257/758 |
| 6,613,443 | B2 | * | 9/2003  | Komatsu et al. .............. 428/469 |
| 6,664,641 | B2 | * | 12/2003 | Ohsaki et al. ................. 257/774 |
| 6,710,263 | B2 | * | 3/2004  | Kobayashi et al. ........... 174/260 |

(Continued)

FOREIGN PATENT DOCUMENTS

| JP | 09-237855  A1 | 9/1997 |
| JP | 2005-123548 A1 | 5/2005 |

(Continued)

OTHER PUBLICATIONS

Written Opinion dated Aug. 30, 2011.

*Primary Examiner* — Julio J. Maldonado
*Assistant Examiner* — Charles N Ausar-El
(74) *Attorney, Agent, or Firm* — Burr & Brown

(57) ABSTRACT

A circuit board that can decrease thermal stress acting between a semiconductor element and a board in association with temperature alteration and has high mechanical strength (rigidity) as a whole board (including a multilayer wiring layer) is provided. Ceramic base material having a coefficient of thermal expansion close to that of a semiconductor element and inner layer wiring are integrally sintered, and the circuit board is configured so that fine-lined conductor structure corresponding to a multilayer wiring layer in the inner layer wiring has predetermined width, intralayer interval and interlayer interval. Thereby, thermal stress acting between a semiconductor element and the board when the board is exposed to temperature alteration in a condition where it is joined with the semiconductor element is suppressed, rigidity of the board is maintained, and its reliability against temperature cycle is increased.

13 Claims, 2 Drawing Sheets

U.S. PATENT DOCUMENTS

| | | | |
|---|---|---|---|
| 7,282,797 B2 * | 10/2007 | Emrick et al. | 257/702 |
| 7,332,805 B2 * | 2/2008 | Natarajan et al. | 257/700 |
| 7,365,431 B2 * | 4/2008 | Matsubara | 257/758 |
| 7,691,469 B2 * | 4/2010 | Nomiya | 428/210 |
| 2002/0149101 A1 * | 10/2002 | Ikeda et al. | 257/703 |
| 2006/0081977 A1 * | 4/2006 | Sakai et al. | 257/703 |
| 2010/0025081 A1 * | 2/2010 | Arai et al. | 174/251 |
| 2012/0012843 A1 * | 1/2012 | Matsubara | 257/48 |

FOREIGN PATENT DOCUMENTS

| | | | |
|---|---|---|---|
| JP | 2005-123548 | * | 12/2005 |
| JP | 2010-021386 A1 | | 1/2010 |
| JP | 2010-034403 A1 | | 2/2010 |
| JP | 2010-034403 | * | 12/2010 |
| WO | 2007/116544 A1 | | 10/2007 |
| WO | 2008/111408 A1 | | 9/2008 |

* cited by examiner

LAMINATED AND SINTERED CERAMIC CIRCUIT BOARD, AND SEMICONDUCTOR PACKAGE INCLUDING THE CIRCUIT BOARD

BACKGROUND OF THE INVENTION

1. Field of the Invention

The present invention relates to a laminated and sintered ceramic circuit board. Specifically, the present invention relates to a laminated and sintered ceramic circuit board having a fine-lined inner layer wiring. Further, the present invention also relates to a semiconductor package including the laminated and sintered ceramic circuit board.

2. Description of the Related Art

Responding to rising performance and downsizing of electronic devices and the like, market need to fast, downsized and short-in-height (thin) circuit element packages used in various electronic devices (for example, semiconductor packages such as IC packages and the like) have been going on increasing. As a result, in a circuit element (for example, a semiconductor element such as an IC chip, a resistive element, a capacitative element, an inductor element and the like) constituting a circuit element package, especially in a semiconductor element, demand for fast signal transmission, fine-lined (minute) pitch (interval) of wirings and a thin element goes on increasing.

Since wirings become narrow and the interval thereof becomes narrower in accordance with the faster signal transmission and fine-lined pitch of wirings in a semiconductor element as described above and therefore the influence of wiring capacity becomes more obvious, it is necessary to decrease the dielectric constant of insulating material between wirings on the surface of the semiconductor element. However, in general, insulating material with low dielectric constant is fragile and the strength of surface wiring tends to decrease in combination with fine-lined pitch of wirings. When the strength of surface wiring decreases thus, for example, by means of thermal stress due to the difference between coefficients of thermal expansion of a semiconductor element and a board to which the semiconductor element is joined, the breakdown of their joining part becomes more likely to occur. In addition, the thinner a semiconductor element becomes, the lower the mechanical strength of the whole semiconductor element necessarily becomes.

By the way, a semiconductor element is often joined to a board (package board) by means of, for example, flip-chip joining or the like to be configured as a circuit element package. On one surface of two principal surfaces of the package board, to which the semiconductor element is joined, terminals, lands and the like with a relatively narrow pitch corresponding to the wiring pitch of the semiconductor element fine-lined as described above are generally disposed. On the other hand, on the other surface of two principal surfaces of the package board, opposite to the side to which the semiconductor element is joined, terminals and the like with a relatively wide pitch corresponding to the wiring pitch of a circuit board (for example, a mother board and the like), to which the circuit element package is joined, are generally disposed.

In addition, a package board generally comprises a wiring consisting of a conductor embedded within the board (inner layer wiring). For example, the inner layer wiring connects the terminals on the two principal surfaces with each other. In this case, the inner layer wiring is generally configured so that the wiring pitch changes from a relatively narrow terminal pitch on the semiconductor element side to a relatively wide terminal pitch on the circuit board side. Namely, it can be said that the package board bears the function of conversion of the relatively narrow terminal pitch on the semiconductor element side into the relatively wide terminal pitch on the circuit board side. As a circuit element package as described above, for example, a BGA (Ball Grid Array) package, in which terminals on a circuit board side are configured as BGA balls (ball bumps), and the like can be exemplified.

As base material for the above-described board, resin such as glass epoxy is generally used. Therefore, its coefficient of thermal expansion is different from that of silicon constituting a semiconductor element, and problems such as breakdown of a joining part between a semiconductor element and a package board, due to thermal stress acting between the semiconductor element and the package board in association with temperature alteration that a circuit element package suffers from, for example, on soldering the semiconductor element to the package board by means of flip-chip joining or the like, soldering the circuit element package to the circuit board by means of BGA reflow, or the like, are concerned.

Accordingly, in the art, technology to interpose an intermediate board (interposer) between a semiconductor element and a package board and thereby disperse thermal stress as described above to a joining part between the semiconductor element and the intermediate board and a joining part between the intermediate board and the package board has been developed (for example, refer to Patent Document 1). However, demand for fast signal transmission, fine-lined wiring pitch and a thin element as mentioned previously goes on increasing more and more and accordingly problems such as breakdown of a joining part of a semiconductor element due to thermal stress acting on the joining part of the semiconductor element go on deepening more and more.

In addition, introduction of an intermediate board into a circuit element package leads to increase in thickness (elongation-in-height) of the circuit element package. Accordingly, in order to meet the market demand for a short-in-height (thin) circuit element package as mentioned previously, it is necessary to make the intermediate board as short-in-height (thin) as possible. However, as mentioned above, since a certain level of thermal stress acts on a joining part between a semiconductor element and an intermediate board, sufficient mechanical strength (rigidity) of the intermediate board cannot be maintained when the intermediate board is made thinner for the purpose of lowering the height of a circuit element package, and consequently problems such as warpage of the intermediate board may occur due to the thermal stress acting between the semiconductor element and the intermediate board.

In the art, as a countermeasure for such a problem, an approach to complement the rigidity of an intermediate board, for example, by disposing a reinforcing member around the intermediate board has been proposed (for example, refer to Patent Document 2). According to such a technology, deformation (for example, warpage or the like) of an intermediate board due to thermal stress acting between a semiconductor element and the intermediate board is suppressed. However, addition of such a reinforcing member may complicate the manufacturing process of a circuit element package and consequently lead to increase in the manufacturing cost of the circuit element package.

Accordingly, in order solve problems as mentioned above due to thermal stress acting between a semiconductor element and an intermediate board, it is desirable to sufficiently decrease thermal stress itself acting between the semiconductor element and the intermediate board. Therefore, in the art, a technology to interpose an intermediate board (interposer) with base material made of material (for example, silicon, glass or the like) having a coefficient of thermal expansion close to that of silicon constituting a semiconductor element has been developed. Thereby, thermal stress acting between the semiconductor element and the intermediate board can be decreased.

On the other hand, as mentioned previously, since the wiring pitch in a semiconductor element has become more and more remarkably fine-lined, in the art, an approach to make not only a package board, but also an intermediate board bear the function of conversion of the relatively narrow terminal pitch on the semiconductor element side into the relatively wide terminal pitch on a circuit board side has been made. Specifically, an intermediate board comprising a multilayer wiring layer with an inner layer wiring embedded therein and configured so that its wiring pitch changes from relatively narrow terminal pitch on a semiconductor element side to relatively wide terminal pitch on a circuit board side has been proposed.

However, since, in the above-described intermediate board with base material made of silicon, glass or the like, it is difficult to configure conductor having a complicated structure like the above-mentioned inner layer within the base material, in general, a through conductor (via hole) extending in its thickness direction (direction perpendicular to its principal surfaces) is formed in the base material, and a conductor having a complicated structure converting the wiring pitch is formed within a multilayer wiring layer consisting of material other than that of the base material, which is separately formed on the semiconductor element side of the base material.

It is known that the above-described multilayer wiring layer can be formed by means of thin film processes such as sputtering, chemical vapor deposition (CVD) and the like, and wafer processes including a microfabrication process through photolithography and etching and the like (for example, refer to Patent Document 2)

The configuration wherein a multilayer wiring layer separate from an intermediate board is disposed as described above may not only increase its manufacturing cost, but also lower its reliability (for example, temperature cycle reliability) due to detachment of the multilayer wiring layer from base material for example on repeated use or the like. In addition, since the mechanical strength of an intermediate board with base material of, for example, silicon, glass or the like, as well as a multilayer wiring layer disposed on its principal surface is low, when the thickness thereof is decreased for the purpose of making a circuit element package as mentioned previously short-in-height, a problem that the mechanical strength of the whole intermediate board decreases may occur.

As the above, in the art, demand for a circuit board with high reliability against temperature alteration and high mechanical strength has been existing as used to be.

CITATION LIST

Patent Literature

[Patent Document 1] Japanese Patent Application Laid-Open (kokai) No. 2005-123548

[Patent Document 2] Japanese Patent Application Laid-Open (kokai) No. 2010-034403

SUMMARY OF THE INVENTION

Problem to Be Solved

As mentioned previously, in the art, demand for a circuit board with high reliability against temperature alteration and high mechanical strength has been existing as used to be. Specifically, in the art, a technology that can decrease thermal stress acting between a semiconductor element and a board in association with temperature alteration, as well as provide a circuit board with high mechanical strength as a whole board (including a multilayer wiring layer) has been needed.

The present invention has been conceived to meet such a demand. Namely, the present invention has an objective to provide a circuit board with high reliability against temperature alteration and high mechanical strength. Specifically, the present invention has an objective to provide a board that can decrease thermal stress acting between a semiconductor element and a board in association with temperature alteration, as well as has high mechanical strength (rigidity) as a whole board (including a multilayer wiring layer). Further, the present invention has another objective to provide a fast, downsized and short-in-height (thin) semiconductor package with high reliability by using such a circuit board.

Means for Solving the Problem

The above-described one objective can be achieved by laminated and sintered ceramic circuit board, which comprises:

base material that comprises plural dielectric layers comprising ceramic, one or more first surface electrodes disposed to expose at a first principal surface that is one surface of two principal surfaces and comprising conductor, one or more second surface electrodes disposed to expose at a second principal surface that is the other surface of said two principal surfaces and comprising conductor, and an inner layer wiring embedded within said base material and comprising conductor;

wherein said inner layer wiring electrically connects at least a portion of said first surface electrodes and at least a portion of said second surface electrodes, said inner layer wiring comprises a through conductor extending through at least one of said plural dielectric layers in a direction perpendicular to said principal surfaces and inplane conductors extending in plural planes parallel to said principal surfaces, at least a portion of said inplane conductors are configured as a fine-lined inplane wiring, where its cross-section surface perpendicular to its extending direction has dimension of 15 µm or less in a plane parallel to said principal surfaces, and the interval of said inplane conductors adjacent in a plane parallel to said principal surfaces is 15 µm or less, said dielectric layer(s) includes a region intervening two planes, where said two planes are parallel to said principal surfaces and include said inplane fine-lined conductor, said region does not include said inplane fine-lined conductor, and said region has dimension of more than 4 µm and 25 µm or less in a direction perpendicular to said principal surfaces.

Further, the above-described another objective can be achieved by a semiconductor package comprising a semiconductor element and a package board, wherein:

said semiconductor element and said package board are electrically connected through an intermediate board interposed between said semiconductor element and said package board, said intermediate board is a laminated and sintered ceramic circuit board, which comprises:

base material that comprises plural dielectric layers comprising ceramic, one or more first surface electrodes disposed to expose at a first principal surface that is one surface of two principal surfaces and comprising conductor, one or more second surface electrodes disposed to expose at a second principal surface that is the other surface of said two principal surfaces and comprising conductor, and an inner layer wiring embedded within said base material and comprising conductor;

wherein said inner layer wiring electrically connects at least a portion of said first surface electrodes and at least a portion of said second surface electrodes, said inner layer wiring comprises a through conductor extending through at least one of said plural dielectric layers in a direction perpendicular to said principal surfaces and inplane conductors extending in plural planes parallel to said principal surfaces, at least a portion of said inplane conductors are configured as a fine-lined inplane wiring, where its cross-section surface perpendicular to its extending direction has dimension of 15 μm or less in a plane parallel to said principal surfaces, and the interval of said inplane conductors adjacent in a plane parallel to said principal surfaces is 15 μm or less, said dielectric layer(s) includes a region intervening two planes, where said two planes are parallel to said principal surfaces and include said inplane fine-lined conductor, said region does not include said inplane fine-lined conductor, and said region has dimension of more than 4 μm and 25 μm or less in a direction perpendicular to said principal surfaces.

Effect of the Invention

As described above, base material of a laminated and sintered ceramic circuit board according to the present invention comprises plural dielectric layers comprising ceramic. Ceramic has a coefficient of thermal expansion close to that of silicon constituting a semiconductor element. Accordingly, even when the board joined with a semiconductor element is exposed to temperature alteration as mentioned previously, thermal stress acting between the semiconductor element and the intermediate board can be suppressed. In addition, ceramic has higher mechanical strength as compared with conventional board materials (for example, resin and the like). Accordingly, even when the thickness of the board is decreased for the purpose of making a circuit element package as mentioned previously short-in-height or the like, sufficient rigidity can be maintained. Further, in a laminated and sintered ceramic circuit board according to the present invention, an inner layer wiring comprising conductor having a complicated structure converting wiring pitch as mentioned previously is embedded within the base material. Accordingly, unlike the case as in a board according to prior art where a multilayer wiring layer consisting of material other than base material is separately formed, increase in manufacturing cost and decrease in temperature cycle reliability can be avoided.

Namely, in accordance with the present invention, a circuit board with high reliability against temperature alteration and high mechanical strength is provided. Specifically, in accordance with the present invention, a board that can decrease thermal stress acting between a semiconductor element and a board in association with temperature alteration, as well as has high mechanical strength (rigidity) as a whole board (including a multilayer wiring layer) is provided. In addition, by using such a circuit board, a fast, downsized and short-in-height (thin) semiconductor package with high reliability is provided.

DESCRIPTION OF THE PREFERRED EMBODIMENTS

Figure 1:
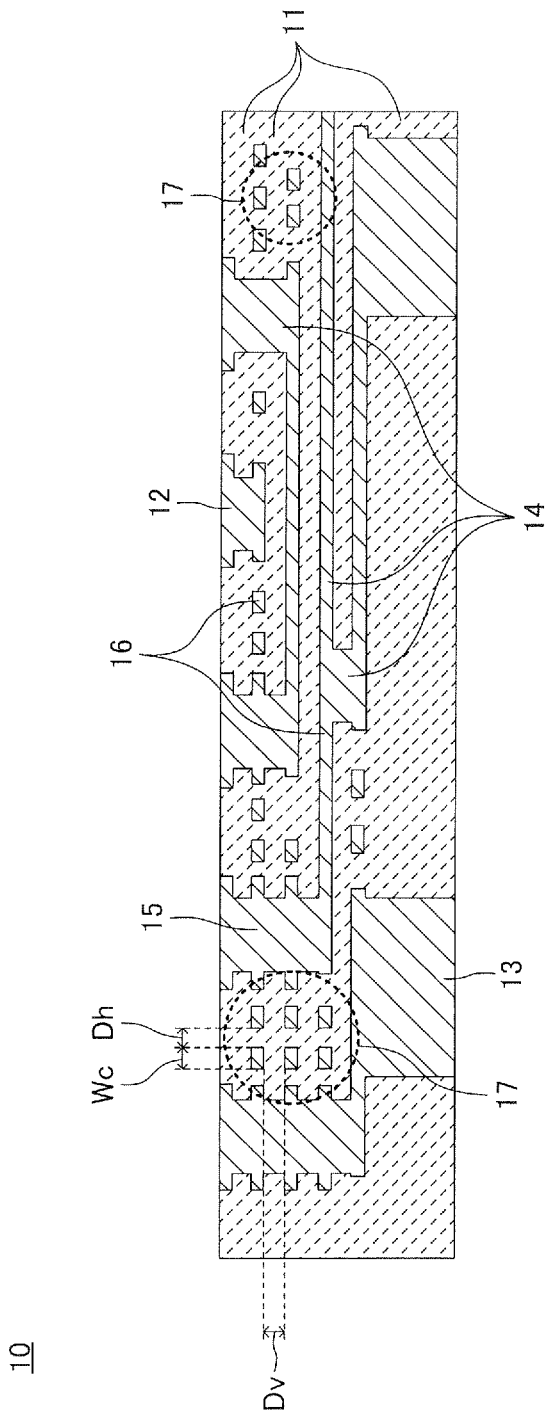
FIG. 1 is a schematic longitudinal sectional view of a laminated and sintered ceramic circuit board according to one embodiment of the present invention.

As mentioned previously, the present invention has an objective to provide a circuit board that can decrease thermal stress acting between a semiconductor element and a board in association with temperature alteration, as well as has high mechanical strength (rigidity) as a whole board (including a multilayer wiring layer).

The inventors have devoted themselves to investigation in order to achieve the above-described objective and consequently have found that by constituting the base material of a board with plural dielectric layers comprising ceramic and integrally disposing a multilayer wiring layer within the base material, thermal stress acting between a semiconductor element and a board in association with temperature alteration in a condition where the semiconductor element and the board are joined can be decreased and sufficient rigidity can be maintained even when the thickness of the board is decreased.

Namely, the first embodiment of the present invention is:

laminated and sintered ceramic circuit board, which comprises:

base material that comprises plural dielectric layers comprising ceramic, one or more first surface electrodes disposed to expose at a first principal surface that is one surface of two principal surfaces and comprising conductor, one or more second surface electrodes disposed to expose at a second principal surface that is the other surface of said two principal surfaces and comprising conductor, and an inner layer wiring embedded within said base material and comprising conductor;

wherein said inner layer wiring electrically connects at least a portion of said first surface electrodes and at least a portion of said second surface electrodes, said inner layer wiring comprises a through conductor extending through at least one of said plural dielectric layers in a direction perpendicular to said principal surfaces and inplane conductors extending in plural planes parallel to said principal surfaces, at least a portion of said inplane conductors are configured as a fine-lined inplane wiring, where its cross-section surface perpendicular to its extending direction has dimension of 15 μm or less in a plane parallel to said principal surfaces, and the interval of said inplane conductors adjacent in a plane parallel to said principal surfaces is 15 μm or less, said dielectric layer(s) includes a region intervening two planes, where said two planes are parallel to said principal surfaces and include said inplane fine-lined conductor, said region does not include said inplane fine-lined conductor, and said region has dimension of more than 4 μm and 25 μm or less in a direction perpendicular to said principal surfaces.

As described above, the laminated and sintered ceramic circuit board according to the present embodiment comprises base material comprising plural dielectric layers comprising ceramic. As mentioned previously, ceramic has a coefficient of thermal expansion close to that of silicon constituting a semiconductor element. Accordingly, in the laminated and sintered ceramic circuit board according to the present embodiment, even when the board in a condition where it is joined with a semiconductor element is exposed to temperature alteration as mentioned previously, the difference between dimension change of the semiconductor element and that of the board is small. As a result, in the laminated and sintered ceramic circuit board according to the present embodiment, thermal stress acting between the semiconductor element and the board can be suppressed.

Thereby, problems such as breakdown of a joining part between a semiconductor element and a board, due to thermal stress acting between the semiconductor element and the board in association with temperature alteration that the semiconductor element and the board suffer from, for example, on soldering the semiconductor element to the board by means of flip-chip joining or the like, soldering a semiconductor package including the board to a circuit board (for example, mother board) by means of BGA reflow, or the like, are decreased.

In addition, as mentioned previously, ceramic has higher mechanical strength as compared with conventional board materials (for example, resin and the like). Accordingly, in the laminated and sintered ceramic circuit board according to the present embodiment, even when the thickness of the board is decreased for the purpose of making a circuit element package as mentioned previously short-in-height or the like, sufficient rigidity can be maintained. Thereby, problems such as warpage of the board due to thermal stress acting between a semiconductor element and the board in association with temperature alteration that the semiconductor element and the board suffer from are decreased.

As mentioned previously, in the laminated and sintered ceramic circuit board according to the present embodiment, one or more first surface electrodes comprising conductor are disposed to expose at a first principal surface that is one surface of two principal surfaces of the board, and one or more second surface electrodes comprising conductor are disposed to expose at a second principal surface that is the other surface of two principal surfaces of the board. In other words, on each of two principal surfaces (i.e., the first principal surface and the second principal surface) of the laminated and sintered ceramic circuit board according to the present embodiment, one or more surface electrodes (i.e., respectively the first surface electrodes and the second surface electrodes) for being joined with a target object (for example, a semiconductor element, a package board or the like), which is joined to each of the principal surfaces, to establish electrical connection are disposed.

Specifically, on the first principal surface of the laminated and sintered ceramic circuit board according to the present embodiment, one or more first surface electrodes are disposed so that conductor with size and shape required to be joined and establish electrical connection with a target object (for example, a semiconductor element or the like) to be joined on the first principal surface side at a position corresponding to a terminal or electrode (for example, bump or the like) that the target object comprises for electrical joining. On the other hand, on the second principal surface of the laminated and sintered ceramic circuit board according to the present embodiment, one or more second surface electrodes are disposed so that conductor with size and shape (on which a bump or the like can be disposed) required to be joined and establish electrical connection with a target object (for example, a package board or the like) to be joined on the second principal surface side at a position corresponding to a terminal or electrode (for example, land or the like) that the target object comprises for electrical joining.

As described above, when plural first surface electrodes are disposed on the first principal surface of the laminated and sintered ceramic circuit board according to the present embodiment, plural first surface electrodes with pitch corresponding to that of terminals or electrodes that a target object to be joined on the first principal surface side comprises for electrical joining are disposed on the first principal surface. Similarly, when plural second surface electrodes are disposed on the second principal surface of the laminated and sintered ceramic circuit board according to the present embodiment, plural second surface electrodes with pitch corresponding to that of terminals or electrodes that a target object to be joined on the second principal surface side comprises for electrical joining are disposed on the second principal surface.

Although electrical joining of the first surface electrodes and the second surface electrodes exposing respectively at the first principal surface and the second principal surface of the laminated and sintered ceramic circuit board according to the present embodiment with target objects to be joined on respective principal surfaces can be achieved by means of, for example, soldering, a method for electrically connecting them is not limited to a certain technique, and any technique known in the art can be used to achieve the same. As examples of such techniques, besides soldering, for example, intermetallic compound joining such as Cu—Cu3Sn—Cu, diffusion joining such as Cu—Cu, W—W, and the like can be exemplified. Since a laminates and sintered ceramic circuit board has high heat-resistance and rigidity, a terminal joining process requiring high temperature of 300° C. or higher or application of pressure, which cannot be applied to a conventional resin circuit board, can be applied thereto, and the option for terminal joining processes increases.

As mentioned previously, in the laminated and sintered ceramic circuit board according to the present embodiment, an inner layer wiring comprising conductor is embedded within said base material. In addition, said inner layer wiring electrically connects at least a portion of said first surface electrodes and at least a portion of said second surface electrodes. Further, said inner layer wiring comprises a through conductor (via hole) extending through at least one of said plural dielectric layers in a direction perpendicular to said principal surfaces, and inplane conductors extending in plural planes parallel to said principal surfaces. It can be said that a region including inplane conductors extending in plural planes parallel to said principal surfaces is a region corresponding to the previously mentioned multilayer wiring layer.

On the other hand, as mentioned above, when plural first surface electrodes are disposed on the first principal surface of the laminated and sintered ceramic circuit board according to the present embodiment, the first surface electrodes with pitch corresponding to that of terminals or electrodes that a target object to be joined on the first principal surface side comprises for electrical joining are disposed on the first principal surface. Similarly, when plural second surface electrodes are disposed on the second principal surface of the laminated and sintered ceramic circuit board according to the present embodiment, plural second surface electrodes with pitch corresponding to that of terminals or electrodes that a target object to be joined on the second principal surface side comprises for electrical joining are disposed on the second principal surface.

Accordingly, when the pitch of plural first surface electrodes is different from the pitch of plural second surface electrodes, at least a portion (for example, a region including inplane conductors extending in plural planes parallel to said principal surfaces) of said inplane conductors can bear the function of conversion of the pitch on the first surface electrodes side into the pitch on the second surface electrodes side or the function of conversion of the pitch on the second surface electrodes side into the pitch on the first surface electrodes side.

As mentioned previously, said inner layer wiring electrically connects at least a portion of said first surface electrodes and at least a portion of said second surface electrodes. In other words, some of the first surface electrodes disposed on the first principal surface may be connected with none of the second surface electrodes disposed on the second principal surface. Such a first surface electrode which is not connected with any of the second surface electrodes may be electrically connected with another first surface electrode through an inner layer wiring. Alternatively, such a first surface electrode which is not connected with any of the second surface electrodes may be electrically connected only with conductor of an inner layer wiring which is not connected with any other surface electrodes (for example, when an open stab is formed). Thus, in the laminated and sintered ceramic circuit board according to the present embodiment, pattern of electrical connection among the first surface electrodes, the second surface electrodes, and the inner layer wiring may be variously configured in accordance with the design and specification of a circuit element package, in which the board is used, and the like.

Further, in the laminated and sintered ceramic circuit board according to the present embodiment, as mentioned previously, at least a portion of said inplane conductors are configured as a fine-lined inplane wiring, where its cross-section surface perpendicular to its extending direction has dimension of 15 µm or less in a plane parallel to said principal surfaces, and the interval of said inplane conductors adjacent in a plane parallel to said principal surfaces is 15 µm or less.

In the above, the dimension of the inplane conductor's cross-section surface perpendicular to its extending direction in a plane parallel to said principal surfaces is a concept corresponding to the width of the inplane conductor constituting at least a portion of said inner layer wiring. The inplane conductor's extending direction is a longitudinal direction (extending direction) of the inplane conductor constituting at least a portion of said inner layer wiring, and it can be said to be the direction in which electrical current flows in the inplane conductor. In addition, the plane parallel to said principal surfaces is a plane perpendicular to the thickness direction of the board, and it is a plane perpendicular to the lamination direction of said plural dielectric layers. Accordingly, it can be said that the above-described "dimension" is a "width" of cross-section surface of a certain portion of the inplane conductor constituting at least a portion of said inner layer wiring in a plane parallel to said principal surfaces.

In addition, in the above, the interval of the inplane conductors adjacent in a plane parallel to said principal surfaces is a concept corresponding to the distance between two adjacent inplane conductors constituting at least a portion of said inner layer wiring. Similarly to the above, the plane parallel to said principal surfaces is a plane perpendicular to the thickness direction of the board, and it is a plane perpendicular to the lamination direction of said plural dielectric layers. Namely, the above-described two adjacent inplane conductors are embedded at same position (depth) in the thickness direction of the board. Accordingly, it can be said that the above-described "interval" is a minimum dimension of base material (dielectric) existing between two adjacent inplane conductors constituting at least a portion of said inner layer wiring in a plane parallel to said principal surfaces.

As mentioned at the beginning, responding to rising performance and downsizing of electronic devices and the like, market need to fast, downsized and short-in-height (thin) circuit element packages used in various electronic devices (for example, semiconductor packages such as IC packages and the like) have been going on increasing. As a result, in a circuit element (for example, a semiconductor element such as an IC chip, a resistive element, a capacitative element, an inductor element and the like) constituting a circuit element package, especially in a semiconductor element, demand for fast signal transmission, fine-lined (minute) pitch (interval) of wirings and a thin element goes on increasing. Accordingly, also in a board, to which such a semiconductor element is joined, fine-lined wiring pitch (interval) is needed.

From such a viewpoint, it is desirable that the pitches of wirings (conductor) constituting the first surface electrodes and the second surface electrodes, as well as the inner layer wiring that the laminated and sintered ceramic circuit board according to the present embodiment comprises are also fine-lined. Specifically, in the laminated and sintered ceramic circuit board according to the present embodiment, as mentioned previously, at least a portion of said inplane conductors are configured as a fine-lined inplane wiring, where its cross-section surface perpendicular to its extending direction has dimension of 15 µm or less, more preferably 10 µm or less, in a plane parallel to said principal surfaces, and the interval of said inplane conductors adjacent in a plane parallel to said principal surfaces is 15 µm or less, more preferably 10 µm or less.

By the way, in a prior art, when a laminated and sintered ceramic circuit board comprising a highly fine-lined inner layer wiring (fine-lined inplane wiring) as described above is to be obtained, there has been a problem that an open failure rate in the inner layer wiring is high. Herein, open failure refers to a problem that continuity cannot be assured in a wiring path in which good continuity should be assured in design (for example, poor continuity, disconnection and the like). Accordingly, an open failure rate refers to an incidence rate of such open failure (for example, poor continuity, disconnection and the like).

Therefore, the inventors have found, as a result of devotion of themselves to investigation, that the above-described open failure rate can be remarkably decreased by making the interval (in the thickness direction of a board) of layers including a fine-lined inplane wiring in a region including a highly fine-lined inner layer wiring (fine-lined inplane wiring) as described above narrower than a certain value. Specifically, in the laminated and sintered ceramic circuit board according to the present embodiment, by configuring the interval of 25 µm or less between a region (layer) defined by planes that are parallel to said principal surfaces and include said fine-lined inplane wiring existing continuously in a direction perpendicular to said principal surfaces and another region (layer) defined similarly and adjacent to the region (layer) in a direction perpendicular to said principal surfaces, the above-described open failure rate can be remarkably decreased.

In other words, the above-described "interval" can be defined as a dimension (thickness) of said dielectric layer(s) included in a region, which intervenes two planes parallel to said principal surfaces and including said inplane fine-lined conductor and does not includes said inplane fine-lined conductor in a direction perpendicular to said principal surfaces. In accordance with the definition, from the viewpoint of decreasing the above-described open failure rate in the laminated and sintered ceramic circuit board according to the present embodiment, it is desirable that said dielectric layer(s) includes a region intervening two planes, where said two planes are parallel to said principal surfaces and include said inplane fine-lined conductor, said region does not include said inplane fine-lined conductor, and said region has dimension of 25 μm or less, more preferably 20 μm or less in a direction perpendicular to said principal surfaces.

However, the inventors have found that, in a laminated and sintered ceramic circuit board comprising a highly fine-lined inner layer wiring (fine-lined inplane wiring) as described above, when the interval (in the thickness direction of the board) of layers including a fine-lined inplane wiring in a region including a highly fine-lined inner layer wiring (fine-lined inplane wiring) as described above is made too narrow, a new problem that a short-circuit failure rate of an inner layer wiring increases occurs. Herein, a short-circuit failure refers to a problem that insulation cannot be assured between distinct wiring paths in which electrical insulation should be assured in design (becomes conduction state) (for example, poor insulation, short-circuit and the like). Accordingly, a short-circuit failure rate refers to an incidence rate of such short-circuit failure (for example, poor insulation, short-circuit and the like).

Therefore, as a result of devotion of themselves to investigation, the inventors have found that the above-described short-circuit failure rate can be remarkably decreased by making the interval (in the thickness direction of a board) of layers including a fine-lined inplane wiring in a region including a highly fine-lined inner layer wiring (fine-lined inplane wiring) as described above wider than a certain value. Specifically, in the laminated and sintered ceramic circuit board according to the present embodiment, by configuring the interval of more than 4 μm between a region (layer) defined by planes that are parallel to said principal surfaces and include said fine-lined inplane wiring existing continuously in a direction perpendicular to said principal surfaces and another region (layer) defined similarly and adjacent to the region (layer) in a direction perpendicular to said principal surfaces, the above-described short-circuit failure rate can be remarkably decreased.

As mentioned above, the above-described "interval" can be defined as a dimension (thickness) of said dielectric layer(s) included in a region, which intervenes two planes parallel to said principal surfaces and including said inplane fine-lined conductor and does not include said inplane fine-lined conductor in a direction perpendicular to said principal surfaces. In accordance with the definition, from the viewpoint of decreasing the above-described short-circuit failure rate in the laminated and sintered ceramic circuit board according to the present embodiment, it is desirable that said dielectric layer(s) includes a region intervening two planes, where said two planes are parallel to said principal surfaces and include said inplane fine-lined conductor, said region does not include said inplane fine-lined conductor, and said region has dimension of more than 4 μm, more preferably more than 5 μm in a direction perpendicular to said principal surfaces.

Accordingly, in the laminated and sintered ceramic circuit board according to the present embodiment, it is desirable that said dielectric layer(s) includes a region intervening two planes, where said two planes are parallel to said principal surfaces and include said inplane fine-lined conductor, said region does not include said inplane fine-lined conductor, and said region has dimension of more than 4 μm and 25 μm or less in a direction perpendicular to said principal surfaces.

As the above, in the laminated and sintered ceramic circuit board according to the present embodiment, by adopting base material that comprises plural dielectric layers comprising ceramic having a coefficient of thermal expansion close to that of silicon constituting a semiconductor element, even when the board joined with a semiconductor element is exposed to temperature alteration as mentioned previously, thermal stress acting between the semiconductor element and the board can be suppressed. In addition, since ceramic has higher mechanical strength as compared with conventional board materials (for example, resin and the like), even when the thickness of the board is decreased for the purpose of making a circuit element package as mentioned previously short-in-height or the like, sufficient rigidity can be maintained. Further, in a laminated and sintered ceramic circuit board according to the present invention, since an inner layer wiring comprising conductor having a complicated structure converting wiring pitch as mentioned previously is embedded within the above-described base material and integrally formed, unlike the case where a multilayer wiring layer consisting of material other than base material is separately formed as in a board according to prior art, increase in manufacturing cost and decrease in temperature cycle reliability can be avoided.

In addition to the above, in the laminated and sintered ceramic circuit board according to the present embodiment, as mentioned previously, both of the above-mentioned open failure and short-circuit failure can be remarkably decreased by confining the interval (in the thickness direction of the board) of layers including a fine-lined inplane wiring in a region including a highly fine-lined inner layer wiring (fine-lined inplane wiring) inside the board within a predetermined range.

Namely, in accordance with the present embodiment, a circuit board with high reliability against temperature alteration, high mechanical strength and low incidence rates of poor continuity and poor insulation in an inner layer wiring can be provided. Specifically, in accordance with the present embodiment, a board that can decrease thermal stress acting between a semiconductor element and a board in association with temperature alteration, and has high mechanical strength (rigidity) as a whole board (including a multilayer wiring layer), and has remarkably low incidence rate of poor continuity and poor insulation in an inner layer wiring can be provided.

By the way, a method for manufacturing the laminated and sintered ceramic circuit board according to the present embodiment may be any method as long as a laminated and sintered ceramic circuit board manufactured by the method meets the above-described requirements, and can be properly selected from various methods used for manufacturing a ceramic circuit board in the art. As specific examples of methods for manufacturing the laminated and sintered ceramic circuit board according to the present embodiment, for example, so-called "gel cast method", "doctor blade method" and the like can be exemplified.

When the above gel cast method is adopted, for example, by disposing conductor pattern on the surface of film-like or thin plate-like protective substrate, by means of printing method such as screen printing method or the like or transfer method such as film transfer method or the like, filling slurry of dielectric comprising ceramic into portions where the conductor pattern is not disposed, laminating necessary number of dielectric sheets (dielectric layers) with the conductor pattern embedded therein obtained by hardening the slurry, and sintering the same, the laminated and sintered ceramic circuit board according to the present embodiment can be obtained.

As the above-described protective substrate, polyethylene terephthalate (PET) film, polyethylene naphthalate (PEN) film and the like are desirably used and, besides resin film, various film-like and plate-like materials such as glass or paper, metal and the like can be used. However, as protective substrate, from the viewpoint of easy detachment handling, flexible one is preferably used.

In addition, for example, for the purpose of easy detachment of the above-described dielectric sheet from protective substrate, for example, release agent or the like may be coated on the surface of the above-described protective substrate. Such release agents include, for example, various chemicals known as release agent in the art. More specifically, as such release agent, well-known silicone series release agent, fluorine series release agent and the like can be used.

The above-described conductor pattern is desirably disposed by forming conductor paste comprising, as major components, at least one or more kinds of metal elected from, for example, gold, silver, copper and the like and thermosetting resin precursor, on the surface of the above-described protective substrate, by means of printing method such as screen printing method or the like or transfer method such as film transfer method or the like. As such thermosetting resin precursor, phenol resin, resole resin, urethane resin, epoxy resin, melamine resin and the like can be used. Among these, phenol resin and resole resin are especially preferred. By disposing such conductor paste on the surface of the above-described protective substrate and thereafter hardening binder contained in the conductor paste, the conductor pattern can be obtained.

As the slurry of the dielectric, for example, slurry comprising resin, ceramic powder and solvent can be exemplified. Herein, resin functions as so-called "binder", and thermosetting resin such as phenol resin, resole resin or polyurethane resin, or polyurethane precursor comprising polyol and polyisocyanate and the like can be used. Among these, thermosetting resin precursor comprising polyol and polyisocyanate is especially preferable.

As ceramic material used as ceramic powder, either oxide series ceramic or non-oxide series ceramic may be used. For example, alumina ($Al_2O_3$), zirconia ($ZrO_2$), barium titanate ($BaTiO_3$), aluminum nitride (AlN), silicon nitride ($Si_3N_4$), silicon carbide (SiC), composite material obtained by sintering silicon carbide together with silicon (Si—SiC), barium oxide (BaO), titanium oxide ($TiO_2$), silicon oxide ($SiO_2$), zinc oxide ($ZnO_2$), neodymium oxide ($Nd_2O_3$) and the like can be used. In addition, only one kind of these materials by itself or combination of two or more kinds of them may be used. Further, as long as the slurry can be prepared, grain size of the ceramic material is not particularly limited.

The laminated and sintered ceramic circuit board according to the present embodiment comprises a highly fine-lined inner layer wiring (fine-lined inplane wiring) as described above. Accordingly, when the grain size of the ceramic material is too large, it may lead to problems such as disconnection of conductor pattern and the like. From such viewpoint, it is desirable that the grain size of ceramic material is smaller than a certain value. For example, in the laminated and sintered ceramic circuit board according to the present embodiment, the average grain size of ceramic material used as ceramic powder is desirably less than 1.8 μm when the dimension of said fine-lined inplane wiring's cross-section surface perpendicular to its extending direction in a plane parallel to said principal surfaces is 15 μm or less, and it is desirably less than 1.5 μm when the dimension is 10 μm or less.

In addition, the above-described solvent is not particularly limited as long as it can solve the above-described resin as binder (and dispersant. if any). As specific examples of solvent, solvent having two or more ester bonds, such as polybasic acid ester (for example, dimethyl glutarate and the like), ester of polyalcohol (for example, triacetin (glyceryl triacetate) and the like) and the like can be exemplified.

Further, the above-described dielectric slurry may contain dispersant besides the above-mentioned resin, ceramic powder and solvent. As specific examples of dispersant, for example, polycarboxylic acid series copolymer, polycarboxylate and the like can be exemplified. By adding such dispersant, viscosity of the slurry before being formed can be decreased and its fluidity can be increased.

By the way, the laminated and sintered ceramic circuit board according to the above-described embodiment comprises a highly fine-lined inner layer wiring (fine-lined inplane wiring) as mentioned above. Accordingly, for example, from the viewpoint of decreasing the resistive loss in a semiconductor package using the board, it is desirable to make the electrical resistance of conductor constituting said first surface electrodes and second surface electrodes, and said inner layer wiring as small as possible to lower the wiring resistance. Accordingly, as a major component of the above-mentioned conductor pattern, gold, silver, copper, which are low-resistance conductors, alloy comprising some of these metals, or the like are desirable to be used.

Namely, the second embodiment of the present invention is:

the laminated and sintered ceramic circuit board according to said first embodiment of the present invention, wherein:

said conductor comprises at least one metal selected from gold, silver and copper.

In the laminated and sintered ceramic circuit board according to the present embodiment, as described above, the conductor constituting said first surface electrodes and second surface electrodes, and said inner layer wiring comprises at least one metal selected from gold, silver and copper. Thereby, even though the laminated and sintered ceramic circuit board according to the present embodiment comprises a highly fine-lined inner layer wiring (fine-lined inplane wiring) with the dimension of its cross-section surface perpendicular to its extending direction in a plane parallel to said principal surfaces of 15 μm or less, its wiring resistance can be suppressed and the resistive loss in a semiconductor package using the board can be decreased.

By the way, low-resistance conductors such as gold, silver, copper, and alloy comprising some of these metals or the like used for the purpose of decreasing the wiring resistance as described above have relatively low melting point as compared with other metals. When dielectric sheet (dielectric layer) with conductor pattern comprising metal with such low melting point embedded therein is sintered at temperature of the melting point of the metal or more, the metal may melt and make it difficult to maintain desired shape of conductor pattern. Accordingly, when such a low-resistance conductor is used in conductor constituting said first surface electrodes and second surface electrodes, and said inner layer wiring, it is desirable to use ceramic that can be sintered at temperature less than the melting point of the low-resistance conductor used therein.

As ceramic that can be sintered at temperature less than the melting point of the low-resistance conductor used therein as described above, it is desirable to use so-called "Low Temperature Co-fired Ceramics (LTCC)". By using LTCC, gold, silver, copper, which are low-resistance conductors, alloy comprising some of these metals, and the like can be used as said conductor. Thereby, even in the laminated and sintered ceramic circuit board comprising a highly fine-lined inner layer wiring (fine-lined inplane wiring) with the dimension of its cross-section surface perpendicular to its extending direction in a plane parallel to said principal surfaces of 15 μm or less, its wiring resistance can be suppressed and the resistive loss in a semiconductor package using the board can be decreased and, in addition, the problem that when dielectric sheet (dielectric layer) with conductor pattern comprising metal with such low melting point embedded therein is sintered, the metal may melt and make it difficult to maintain desired shape of conductor pattern can be avoided.

Specifically, the third embodiment of the present invention is:

the laminated and sintered ceramic circuit board according to said second embodiment of the present invention, wherein:
said conductor comprises copper,
said ceramic can be sintered at temperature less than 1080° C.

In addition, the fourth embodiment of the present invention is:

the laminated and sintered ceramic circuit board according to said second embodiment of the present invention, wherein:
said conductor comprises silver,
said ceramic can be sintered at temperature less than 960° C.

As mentioned above, as ceramic constituting the base material of the laminated and sintered ceramic circuit board according to the above-described two embodiments, for example, LTCC can be exemplified. As such LTCC, for example, material made from mixture of glass powder with inorganic powder such as alumina, aluminum nitride, silicon nitride, silica, mullite and the like, and inorganic composition comprising as a major component, for example, BaO, $Al_2O_3$ and $SiO_2$, or the like can be exemplified.

As specific examples of material made from mixture of glass powder and inorganic powder, for example, borosilicate series glass with a major component of $B_2O_3$—$SiO_2$, and glass containing, in the borosilicate series glass, for example, alkaline-earth metal oxide such as CaO, MgO or the like as a major component and ZnO, $ZrO_2$ or the like as an accessory component, or $SiO_2$ and alkaline metal oxide as a major component and, similarly to the above, ZnO, $ZrO_2$ or the like as an accessory component can be used. As the above-described glass, for example, crystallized glass such as diopside-composition series, cordierite-composition series, spodumene-composition series or the like may be used. In addition, since high strength can be obtained by means of crystallization, crystallized glass power may be used by itself.

As mentioned above, in the laminated and sintered ceramic circuit board according to the above-described two embodiments, low-resistance conductor is selected as conductor constituting said first surface electrodes and second surface electrodes, and said inner layer wiring, and ceramic that can be sintered at temperature less than the melting point of the low-resistance conductor is used. Thereby, even though the laminated and sintered ceramic circuit board according to these embodiments comprises a highly fine-lined inner layer wiring (fine-lined inplane wiring) with the dimension of its cross-section surface perpendicular to its extending direction in a plane parallel to said principal surfaces of 15 μm or less, its wiring resistance can be suppressed and the resistive loss in a semiconductor package using the board can be decreased.

Further, in the laminated and sintered ceramic circuit board according to these embodiments, since ceramic constituting the base material of the board can be sintered at temperature less than the melting point of the low-resistance conductor, the problem that when the base material that comprises dielectric layers comprising the ceramic is sintered, the metal may melt and make it difficult to maintain desired shape of conductor pattern can be avoided.

By the way, as mentioned previously, the present invention has another objective to provide a fast, downsized and short-in-height (thin) semiconductor package with high reliability by using a circuit board that can decrease thermal stress acting between a semiconductor element and the board in association with temperature alteration and has high mechanical strength (rigidity) as a whole board (including a multilayer wiring layer).

The above-described another objective can be achieved by a semiconductor package wherein a semiconductor element and a package board are electrically connected through the laminated and sintered ceramic circuit board according to some embodiments of the present invention as mentioned previously and other embodiments. Now, some embodiments as a semiconductor package using as an intermediate board the laminated and sintered ceramic circuit board according to some embodiments of the present invention as mentioned previously will be listed below. However, since description about the laminated and sintered ceramic circuit board according to some embodiments of the present invention as mentioned previously has been already mentioned hereinbefore, such description about the laminated and sintered ceramic circuit board according to some embodiments of the present invention as mentioned previously may be omitted in the following description about embodiments as a semiconductor package.

Namely, the fifth embodiment of the present invention is:

a semiconductor package comprising a semiconductor element and a package board, wherein:

said semiconductor element and said package board are electrically connected through an intermediate board interposed between said semiconductor element and said package board, said intermediate board is a laminated and sintered ceramic circuit board, which comprises:

base material that comprises plural dielectric layers comprising ceramic, one or more first surface electrodes disposed to expose at a first principal surface that is one surface of two principal surfaces and comprising conductor, one or more second surface electrodes disposed to expose at a second principal surface that is the other surface of said two principal surfaces and comprising conductor, and an inner layer wiring embedded within said base material and comprising conductor;

wherein said inner layer wiring electrically connects at least a portion of said first surface electrodes and at least a portion of said second surface electrodes, said inner layer wiring comprises a through conductor extending through at least one of said plural dielectric layers in a direction perpendicular to said principal surfaces and inplane conductors extending in plural planes parallel to said principal surfaces, at least a portion of said inplane conductors are configured as a fine-lined inplane wiring, where its cross-section surface perpendicular to its extending direction has dimension of 15 μm or less in a plane parallel to said principal surfaces, and the interval of said inplane conductors adjacent in a plane parallel to said principal surfaces is 15 μm or less, said dielectric layer(s) included in a region intervening two planes, where said two planes are parallel to said principal surfaces and include said inplane fine-lined conductor, said region does not include said inplane fine-lined conductor, and said region does has dimension of more than 4 μm and 25 μm or less in a direction perpendicular to said principal surfaces.

The semiconductor element included in the semiconductor package according to the present embodiment is not particularly limited and, as specific examples, for example, integrated circuits (IC), large-scale integrated circuits (LSI) and the like can be exemplified. Herein, semiconductor chips such as integrated circuits (IC), large-scale integrated circuits (LSI) and the like are collectively referred to as "semiconductor IC chips".

As mentioned at the beginning, responding to rising performance and downsizing of electronic devices and the like, in such semiconductor IC chips, demand for fast signal transmission, fine-lined pitch (interval) of wirings and a thin element goes on increasing. Accordingly, it is extremely desirable that, as an intermediate board in a semiconductor package including such a semiconductor IC chip, the laminated and sintered ceramic circuit board according to the present invention is used.

Accordingly, the sixth embodiment of the present invention is:

the semiconductor package according to said fifth embodiment of the present invention, wherein:

said semiconductor element is a semiconductor IC chip.

In addition, as mentioned previously, as base material for a package board, resin such as glass epoxy is generally used.

Accordingly, the seventh embodiment of the present invention is:

the semiconductor package according to one of said fifth or sixth embodiment, wherein:

base material of said package board comprises resin.

Further, in the semiconductor package using as an intermediate board the laminated and sintered ceramic circuit board according to the above-described embodiment, the intermediate board comprises a highly fine-lined inner layer wiring (fine-lined inplane wiring) as mentioned above. Accordingly, for example, from the viewpoint of decreasing the resistive loss in a semiconductor package using the intermediate board, it is desirable to make the electrical resistance of conductor constituting said first surface electrodes and second surface electrodes, and said inner layer wiring as small as possible to lower the wiring resistance. Accordingly, as a major component of the above-mentioned conductor pattern, gold, silver, copper, which are low-resistance conductors, alloy comprising some of these metals, or the like are desirable to be used.

Accordingly, the eighth embodiment of the present invention is:

the semiconductor package according to one of said fifth to seventh embodiments of the present invention, wherein:

said conductor comprises at least one metal selected from gold, silver and copper.

By the way, low-resistance conductors such as gold, silver, copper, and alloy comprising some of these metals or the like used for the purpose of decreasing the wiring resistance as described above have relatively low melting point as compared with other metals. When dielectric sheet (dielectric layer) with conductor pattern comprising metal with such low melting point embedded therein is sintered at temperature of the melting point of the metal or more, the metal may melt and make it difficult to maintain desired shape of conductor pattern. Accordingly, when such a low-resistance conductor is used in conductor constituting said first surface electrodes and second surface electrodes, and said inner layer wiring, it is desirable to use ceramic that can be sintered at temperature less than the melting point of the low-resistance conductor used therein.

As ceramic that can be sintered at temperature less than the melting point of the low-resistance conductor used therein as described above, it is desirable to use LTCC. By using LTCC, gold, silver, copper, which are low-resistance conductors, alloy comprising some of these metals, and the like can be used as said conductor. Thereby, even in the laminated and sintered ceramic circuit board comprising a highly fine-lined inner layer wiring (fine-lined inplane wiring) with the dimension of its cross-section surface perpendicular to its extending direction in a plane parallel to said principal surfaces of 15 μm or less, its wiring resistance can be suppressed and the resistive loss in a semiconductor package using the board can be decreased and, in addition, the problem that when dielectric sheet (dielectric layer) with conductor pattern comprising metal with such low melting point embedded therein is sintered, the metal may melt and make it difficult to maintain desired shape of conductor pattern can be avoided.

Specifically, the ninth embodiment of the present invention is:

the semiconductor package according to said eighth embodiment of the present invention, wherein:

said conductor comprises copper, said ceramic can be sintered at temperature less than 1080° C.

In addition, the tenth embodiment of the present invention is:

the semiconductor package according to said eighth embodiment of the present invention, wherein:

said conductor comprises silver, said ceramic can be sintered at temperature less than 960° C.

As mentioned above, in the semiconductor package according to the above-described two embodiments, low-resistance conductor is selected as conductor constituting said first surface electrodes and second surface electrodes, and said inner layer wiring, and ceramic that can be sintered at temperature less than the melting point of the low-resistance conductor is used. Thereby, even though, in the semiconductor package according to these embodiments, the laminated and sintered ceramic circuit board used as an intermediate board comprises a highly fine-lined inner layer wiring (fine-lined inplane wiring) with the dimension of its cross-section surface perpendicular to its extending direction in a plane parallel to said principal surfaces of 15 μm or less, its wiring resistance can be suppressed and the resistive loss in a semiconductor package using the board can be decreased.

Further, in the semiconductor package according to these embodiments, since ceramic constituting the base material of the laminated and sintered ceramic circuit board can be sintered at temperature less than the melting point of the low-resistance conductor, the problem that when the base material that comprises dielectric layers comprising the ceramic is sintered, the metal may melt and make it difficult to maintain desired shape of conductor pattern can be avoided.

Referring to the drawings attached hereto, configuration and characteristics of the laminated and sintered ceramic circuit board according to some embodiments of the present invention will be described below. However, the description that will be mentioned below is intended only for exemplification, it should not be construed that the scope of the present invention is limited to the following description.

EXAMPLE

1. Configuration of Laminated and Sintered Ceramic Circuit Board According to Embodiment of the Invention As mentioned previously, FIG. 1 is a schematic longitudinal sectional view of a laminated and sintered ceramic circuit board according to one embodiment of the present invention. More specifically, FIG. 1 is a schematic view of cross section surface by a plane perpendicular to the principal surfaces (longitudinal section surface) of the laminated and sintered ceramic circuit board according to one embodiment of the present invention. As shown in FIG. 1, the laminated and sintered ceramic circuit board 10 according to one embodiment of the present invention comprises base material 11 that comprises plural dielectric layers comprising ceramic, one or more first surface electrodes 12 disposed to expose at a first principal surface that is one surface of two principal surfaces of the board 10 and comprising conductor, one or more second surface electrodes 13 disposed to expose at a second principal surface that is the other surface of two principal surfaces of the board 10 and comprising conductor, and an inner layer wiring 14 embedded within said base material 11 and comprising conductor.

In the laminated and sintered ceramic circuit board according to the present experimental example, five first surface electrodes 12 with relatively narrow pitch on the first principal surface and two second surface electrodes 13 with relatively wide pitch on the second principal surface are respectively formed as lands. As shown in FIG. 1, at least a portion of the first surface electrodes 12 and at least a portion of the second surface electrodes 13 are electrically connected through the inner layer wiring 14. In addition, the inner layer wiring 14 comprises through conductors 15 extending through at least one of said plural dielectric layers in a direction perpendicular to the principal surfaces of the board 10 (vertical direction in FIG. 1) and inplane conductors 16 extending in plural planes parallel to said principal surfaces.

The portion exemplified by the region surrounded by dotted line in FIG. 1 represents a portion corresponding to the previously mentioned fine-lined inplane wiring 17. In the fine-lined inplane wiring 17, the dimension (width) (Wc) in a plane parallel to said principal surfaces (horizontal direction in FIG. 1) of the inplane conductor's cross-section surface perpendicular to its extending direction is 15 μm or less, and the interval (Dh) of the inplane conductors adjacent in a plane parallel to said principal surfaces (horizontal direction in FIG. 1) is 15 μm or less.

The dimension (Dv) in a direction perpendicular to said principal surfaces (vertical direction in FIG. 1) of the dielectric layer(s) included in a region, which intervenes two planes parallel to said principal surfaces and including the inplane fine-lined conductor 17 and does not include the inplane fine-lined conductor 17 is more than 4 μm and 25 μm or less. In other words, in the inplane fine-lined conductor 17, the interval of the inplane conductors 16 adjacent in the thickness direction of the laminated and sintered ceramic circuit board 10 (vertical direction in FIG. 1) is more than 4 μm and 25 μm or less.

As the above, the laminated and sintered ceramic circuit board 10 according to the present experimental example adopts, as the base material 11, base material that comprises plural dielectric layers comprising ceramic having a coefficient of thermal expansion close to that of silicon constituting a semiconductor element. Thereby, even when the board 10 is exposed to temperature alteration as mentioned previously in a condition where a semiconductor element is joined therewith, thermal stress acting between the laminated and sintered ceramic circuit board 10 according to the present experimental example and the semiconductor element can be suppressed.

In addition, as mentioned previously, since ceramic has higher mechanical strength as compared with conventional board materials (for example, resin and the like), even when the thickness of the laminated and sintered ceramic circuit board 10 according to the present experimental example is decreased for the purpose of making a circuit element package as mentioned previously short-in-height or the like, sufficient rigidity can be maintained. Further, in the laminated and sintered ceramic circuit board 10 according to the present experimental example, since the inner layer wiring 14 (fine-lined inplane wiring 17) is embedded within the base material 11 and integrally formed, unlike the case where a multilayer wiring layer consisting of material other than base material is separately formed as in a board according to prior art, increase in manufacturing cost and decrease in temperature cycle reliability can be avoided.

In addition to the above, in the laminated and sintered ceramic circuit board 10 according to the present experimental example, as mentioned previously, both of the open failure (for example, poor continuity such as disconnection) and short-circuit failure (for example, poor insulation such as short-circuit) as mentioned previously can be remarkably decreased by confining the interval (in the thickness direction of the board 10) of layers including the fine-lined inplane wiring 17 in a region including a highly fine-lined inner layer wiring 14 (fine-lined inplane wiring 17) inside the board 10 within a predetermined range. Namely, in accordance with the present embodiment, a circuit board with high reliability against temperature alteration and high mechanical strength and low incidence rates of poor continuity and poor insulation in an inner layer wiring can be provided.

2. Relation Between Configuration of Inner Layer Wiring and Open and Short-Circuit Failures (1) Preparation of Sample Boards for Evaluation As mentioned previously, FIG. 2 is a schematic view, schematically showing the configuration of a sample board for investigating the relation between incidence rates of open failure and short-circuit failure in a laminated and sintered ceramic circuit board according to some embodiments of the present invention. More specifically, FIG. 1 is a schematic view of cross section surface by a plane perpendicular to the principal surfaces (longitudinal section surface) of the laminated and sintered ceramic circuit board according to one embodiment of the present invention. The sample boards for evaluation according to the present experimental example were prepared by means of the previously mentioned gel cast method.

Figure 2:
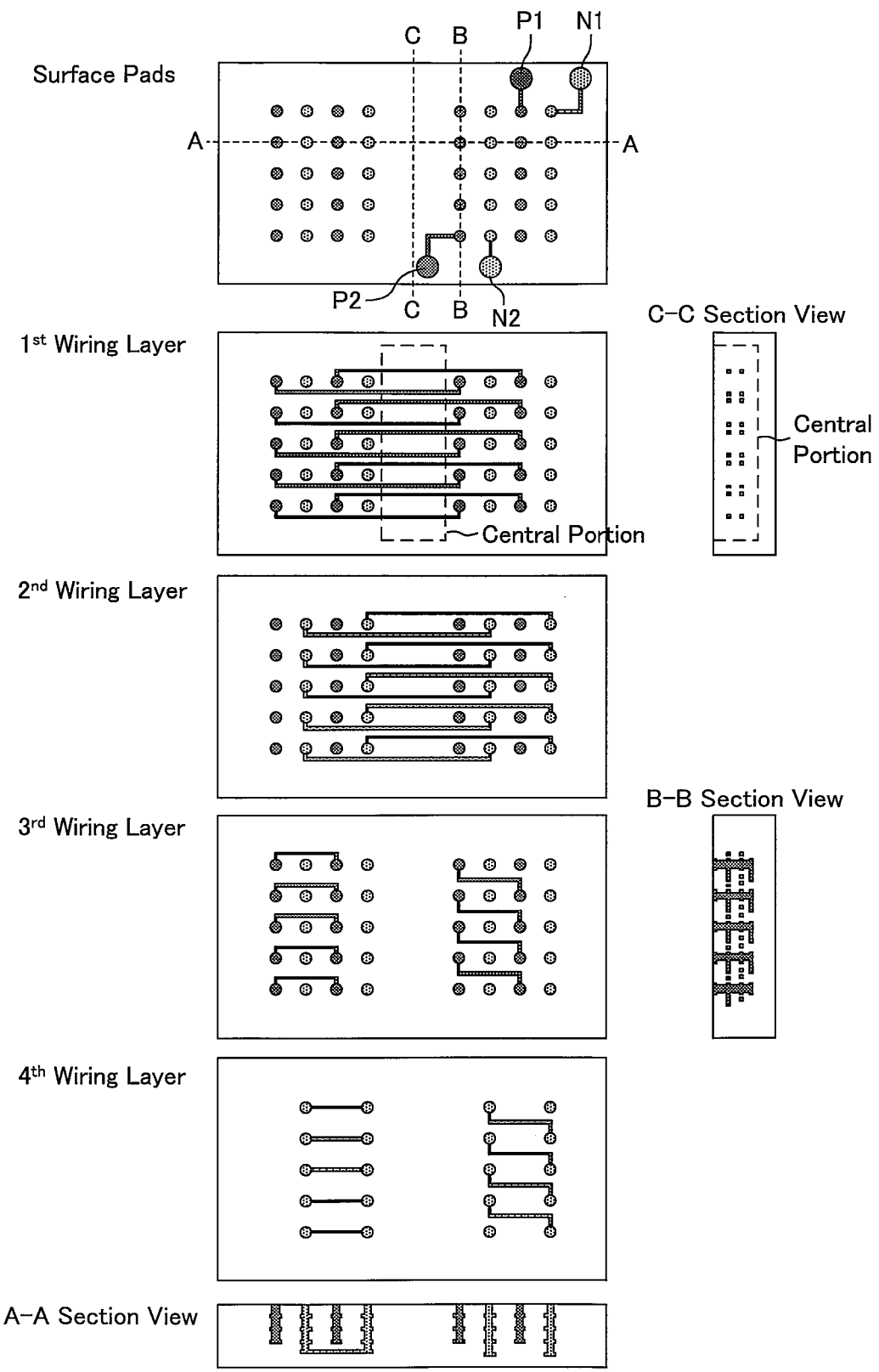
FIG. 2 is a schematic view, schematically showing the configuration of a sample board for investigating the relation between incidence rates of open failure and short-circuit failure in a laminated and sintered ceramic circuit board according to some embodiments of the present invention.

As shown in FIG. 2, the above-described sample boards for evaluation have surface pads (surface electrodes) disposed on one principal surface and four layers of wiring layers (inner layer wiring) disposed within the board. Namely, each of the sample boards for evaluation has a configuration where the surface pads, the first wiring layer, the second wiring layer, the third wiring layer, and the fourth wiring layer are laminated in this order from the top.

Although FIG. 2 depicts eight columns and five rows of via holes (through conductors) and wiring (inplane conductor) that connects some of the via holes with each other, in fact, 10 rows are disposed by repeating a similar pattern. Namely, in the actual sample boards for evaluation, eighty via holes are disposed. Accordingly, in the actual sample boards for evaluation, the terminals P1 and P2 are wire-connected through forty via holes by the inner layer wiring and similarly the terminals N1 and N2 are wire-connected through forty via holes by the inner layer wiring.

The C-C section view shown adjacent to the plan view of the first wiring layer in FIG. 2 is a section view by a plane including the broken line C-C shown in the plan view of the surface pads in FIG. 2 and perpendicular to the principal surfaces of the sample board for evaluation. As shown in the C-C section view, in the inner layer wirings (the first wiring layer and the second wiring layer) in the central portion of the sample board for evaluation (portion surrounded by the broken line of the plan view of the first wiring layer in FIG. 2), the inner layer wirings are disposed close to each other in a plane of each of the wiring layers and interlayer between the first wiring layer and the second wiring layer.

As described above, in the central portion of the sample boards for evaluation, inner layer wirings adjacent in a plane of each of the first wiring layer and the second wiring layer and inner layer wirings adjacent in the thickness direction of the board interlayer between the first wiring layer and the second wiring layer are disposed. Accordingly, it can be said that the central portion of the sample boards for evaluation is a region including inner layer wirings corresponding to the previously mentioned fine-lined inplane wiring.

In addition, the B-B section view shown adjacent to the plan view of the third wiring layer in FIG. 2 is a section view by a plane including the broken line B-B shown in the plan view of the surface pads in FIG. 2 and perpendicular to the principal surfaces of the sample board for evaluation. The broken line B-B is a straight line along the fourth column of via holes from the column of via holes located at the observers' right side end in FIG. 2. As shown in FIG. 2, although five via holes as though conductors extending through the first wiring layer, the second wiring layer, and the third wiring layer are disposed in the B-B section view of the sample board for evaluation, as mentioned above, in the actual sample boards for evaluation, ten of the via holes are disposed.

Further, the A-A section view shown adjacent to the plan view of the fourth wiring layer in FIG. 2 is a section view by a plane including the broken line A-A shown in the plan view of the surface pads in FIG. 2 and perpendicular to the principal surfaces of the sample board for evaluation. The broken line A-A is a straight line along the second row of via holes from the row of via holes located at the observers' top side end in FIG. 2. As shown in FIG. 2, in the A-A section view of the sample board for evaluation, four via holes as though conductors extending through the first to third wiring layers and four via holes as though conductors extending through the first to fourth wiring layers are respectively disposed.

When wirings as designed are successfully formed, continuity between the terminals P1 and P2 and continuity between the terminals N1 and N2 should be respectively assured, while insulation between the terminals P1 and N1 and insulation between the terminals P2 and N2 should be respectively assured. Therefore, in the present experimental example, as shown in the following Table 1, various ceramics were adopted as base materials of the sample boards for evaluation and, in each of the base materials, copper (Cu), silver (Ag), and gold (Au) are adopted as conductors contained in wiring. In addition, in these various combinations of base materials and conductors, the above-mentioned open failure rates and short-circuit failure rates were evaluated with the width (corresponding to We in FIG. 1) and interval (corresponding to Dh in FIG. 1) in a plane of each of the first wiring layer and the second wiring layer of the inner layer wirings disposed in the central portion of the sample boards for evaluation, and the interval (corresponding to Dv in FIG. 1) in the thickness direction of the boards of the inner layer wirings disposed interlayer between the first wiring layer and the second wiring layer changed variously.

TABLE 1

| | Ceramic (LTCC) | Conductor | Sintering Temperature | Sintering Atmosphere |
|---|---|---|---|---|
| Exp. 01 | $B_2O_3$—$SiO_2$ series borosilicate glass powder + alumina powder | Cu | 900° C. | $N_2$/water vapor |
| Exp. 02 | $B_2O_3$—$SiO_2$ series borosilicate glass powder + alumina powder | Ag | 900° C. | Air |
| Exp. 03 | $B_2O_3$—$SiO_2$ series borosilicate glass powder + alumina powder | Au | 900° C. | Air |
| Exp. 04 | CaO—$Al_2O_3$—$B_2O_3$—$SiO_2$ series glass powder + alumina powder | Cu | 900° C. | $N_2$/water vapor |
| Exp. 05 | CaO—$Al_2O_3$—$B_2O_3$—$SiO_2$ series glass powder + alumina powder | Ag | 900° C. | Air |
| Exp. 06 | CaO—$Al_2O_3$—$B_2O_3$—$SiO_2$ series glass powder + alumina powder | Au | 900° C. | Air |
| Exp. 07 | BaO—$Al_2O_3$—$SiO_2$ series inorganic powder | Cu | 900° C. | $N_2$/water vapor |
| Exp. 08 | BaO—$Al_2O_3$—$SiO_2$ series inorganic powder | Ag | 900° C. | Air |
| Exp. 09 | BaO—$Al_2O_3$—$SiO_2$ series inorganic powder | Au | 900° C. | Air |
| Exp. 10 | cordierite-composition (2MgO—$2Al_2O_3$—$5SiO_2$) series crystallized glass powder | Cu | 900° C. | $N_2$/water vapor |
| Exp. 11 | cordierite-composition (2MgO—$2Al_2O_3$—$5SiO_2$) series crystallized glass powder | Ag | 900° C. | Air |
| Exp. 12 | cordierite-composition (2MgO—$2Al_2O_3$—$5SiO_2$) series crystallized glass powder | Au | 900° C. | Air |
| Exp. 13 | diopside-composition ($CaMgSiO_2O_6$) series crystallized glass powder | Cu | 900° C. | $N_2$/water vapor |
| Exp. 14 | diopside-composition ($CaMgSiO_2O_6$) series crystallized glass powder | Ag | 900° C. | Air |
| Exp. 15 | diopside-composition ($CaMgSiO_2O_6$) series crystallized glass powder | Au | 900° C. | Air |

In the evaluation of the open failure rates and the short-circuit failure rates, for each of the combinations of the base materials and conductors shown in Table 1 (Exp.01 to Exp.15), one hundred pieces of sample boards for evaluation were prepared with respective to every distinct combination of the width (Wc) and interval (Dh) in a plane of adjacent conductors, the interval (Dv) in the thickness direction.

(2) Open Failure Rates and Short-Circuit Failure Rates of Sample Boards for Evaluation In the measurement of the open failure rates of the sample boards for evaluation, for each piece of the sample boards for evaluation, a continuity condition between the terminals P1 and P2 and a continuity condition between the terminals N1 and N2 were examined. When any of the continuity conditions was poor, it was judged as open failure. In addition, in the measurement of the short-circuit failure rates of the sample boards for evaluation, for each piece of the sample boards for evaluation, an insulation condition between the terminals P1 and N1 and an insulation condition between the terminals P2 and N2 were examined. When any of the insulation conditions was poor, it was judged as short-circuit failure. The examination on the continuity condition and insulation condition can be performed, for example, by applying predetermined voltage between the terminals as test object and checking whether electrical current is detected or not between the terminals.

As mentioned above, in the evaluation of the open failure rates and the short-circuit failure rates, for each of the combinations of the base materials and conductors shown in Table 1 (Exp.01 to Exp.15), on one hundred pieces of sample boards for evaluation, continuity condition and insulation condition were examined, and the proportions of the number of sample boards for evaluation in which the open failure and the short-circuit failure occurred to the total number of the sample boards for evaluation (100) were obtained as the open failure rates and the short-circuit failure rates respectively. The evaluation results of the open failure rates and the short-circuit failure rates on each of the sample boards for evaluation according to Exp.01 to Exp.15 are listed in the following Tables s to 31.

TABLE 2

(Exp. 01: Open Failure Rate)

| Wc/Dh [μm] | Dv [μm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 1/100 | 36/100 |
| 10/10 | 0/100 | 0/100 | 0/100 | 0/100 | 0/100 | 0/100 | 1/100 | 25/100 |
| 12/12 | 0/100 | 0/100 | 0/100 | 0/100 | 0/100 | 0/100 | 0/100 | 15/100 |
| 15/15 | 0/100 | 0/100 | 0/100 | 0/100 | 0/100 | 0/100 | 0/100 | 8/100 |
| 20/20 | 0/100 | 0/100 | 0/100 | 0/100 | 0/100 | 0/100 | 0/100 | 0/100 |

TABLE 3

(Exp. 01: Short-Circuit Failure Rate)

| Wc/Dh [μm] | Dv [μm] | | | | | | | |
|---|---|---|---|---|---|---|---|---|
| | 3 | 4 | 5 | 10 | 15 | 20 | 25 | 30 |
| 5/5 | 16/100 | 6/100 | 0/100 | 0/100 | 0/100 | 0/100 | 0/100 | 0/100 |
| 10/10 | 14/100 | 4/100 | 0/100 | 0/100 | 0/100 | 0/100 | 0/100 | 0/100 |
| 12/12 | 12/100 | 3/100 | 0/100 | 0/100 | 0/100 | 0/100 | 0/100 | 0/100 |
| 15/15 | 16/100 | 5/100 | 0/100 | 0/100 | 0/100 | 0/100 | 0/100 | 0/100 |
| 20/20 | 16/100 | 6/100 | 0/100 | 0/100 | 0/100 | 0/100 | 0/100 | 0/100 |

TABLE 4

(Exp. 02: Open Failure Rate)

| Wc/Dh [μm] | Dv [μm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 0/100 | 48/100 |
| 10/10 | 0/100 | 0/100 | 0/100 | 0/100 | 0/100 | 0/100 | 1/100 | 30/100 |
| 12/12 | 0/100 | 0/100 | 0/100 | 0/100 | 0/100 | 0/100 | 0/100 | 12/100 |
| 15/15 | 0/100 | 0/100 | 0/100 | 0/100 | 0/100 | 0/100 | 0/100 | 6/100 |
| 20/20 | 0/100 | 0/100 | 0/100 | 0/100 | 0/100 | 0/100 | 0/100 | 0/100 |

TABLE 5

(Exp. 02: Short-Circuit Failure Rate)

| Wc/Dh [μm] | Dv [μm] | | | | | | | |
|---|---|---|---|---|---|---|---|---|
| | 3 | 4 | 5 | 10 | 15 | 20 | 25 | 30 |
| 5/5 | 20/100 | 5/100 | 0/100 | 0/100 | 0/100 | 0/100 | 0/100 | 0/100 |
| 10/10 | 16/100 | 6/100 | 0/100 | 0/100 | 0/100 | 0/100 | 0/100 | 0/100 |
| 12/12 | 10/100 | 5/100 | 0/100 | 0/100 | 0/100 | 0/100 | 0/100 | 0/100 |
| 15/15 | 12/100 | 4/100 | 0/100 | 0/100 | 0/100 | 0/100 | 0/100 | 0/100 |
| 20/20 | 16/100 | 6/100 | 0/100 | 0/100 | 0/100 | 0/100 | 0/100 | 0/100 |

TABLE 6

(Exp. 03: Open Failure Rate)

| Wc/Dh [μm] | Dv [μm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 0/100 | 42/100 |
| 10/10 | 0/100 | 0/100 | 0/100 | 0/100 | 0/100 | 0/100 | 1/100 | 28/100 |
| 12/12 | 0/100 | 0/100 | 0/100 | 0/100 | 0/100 | 0/100 | 0/100 | 10/100 |
| 15/15 | 0/100 | 0/100 | 0/100 | 0/100 | 0/100 | 0/100 | 0/100 | 6/100 |
| 20/20 | 0/100 | 0/100 | 0/100 | 0/100 | 0/100 | 0/100 | 0/100 | 0/100 |

TABLE 7

(Exp. 03: Short-Circuit Failure Rate)

| Wc/Dh [μm] | Dv [μm] | | | | | | | |
|---|---|---|---|---|---|---|---|---|
| | 3 | 4 | 5 | 10 | 15 | 20 | 25 | 30 |
| 5/5 | 14/100 | 3/100 | 0/100 | 0/100 | 0/100 | 0/100 | 0/100 | 0/100 |
| 10/10 | 10/100 | 5/100 | 0/100 | 0/100 | 0/100 | 0/100 | 0/100 | 0/100 |
| 12/12 | 13/100 | 4/100 | 0/100 | 0/100 | 0/100 | 0/100 | 0/100 | 0/100 |
| 15/15 | 9/100 | 6/100 | 0/100 | 0/100 | 0/100 | 0/100 | 0/100 | 0/100 |
| 20/20 | 11/100 | 7/100 | 0/100 | 0/100 | 0/100 | 0/100 | 0/100 | 0/100 |

TABLE 8

(Exp. 04: Open Failure Rate)

| Wc/Dh [μm] | Dv [μm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | /100 | 0/100 | 1/100 | 1/100 | 28/100 |
| 10/10 | 0/100 | 0/100 | 0/100 | 0/100 | 0/100 | 0/100 | 1/100 | 26/100 |
| 12/12 | 0/100 | 0/100 | 0/100 | 0/100 | 0/100 | 0/100 | 0/100 | 12/100 |
| 15/15 | 0/100 | 0/100 | 0/100 | 0/100 | 0/100 | 0/100 | 0/100 | 6/100 |
| 20/20 | 0/100 | 0/100 | 0/100 | 0/100 | 0/100 | 0/100 | 0/100 | 0/100 |

TABLE 9

(Exp. 04: Short-Circuit Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 10/100 | 7/100 | 0/100 | 0/100 | 0/100 | 0/100 | 0/100 | 0/100 |
| 10/10 | 18/100 | 6/100 | 0/100 | 0/100 | 0/100 | 0/100 | 0/100 | 0/100 |
| 12/12 | 13/100 | 8/100 | 0/100 | 0/100 | 0/100 | 0/100 | 0/100 | 0/100 |
| 15/15 | 9/100 | 5/100 | 0/100 | 0/100 | 0/100 | 0/100 | 0/100 | 0/100 |
| 20/20 | 14/100 | 6/100 | 0/100 | 0/100 | 0/100 | 0/100 | 0/100 | 0/100 |

TABLE 10

(Exp. 05: Open Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 1/100 | 20/100 |
| 10/10 | 0/100 | 0/100 | 0/100 | 0/100 | 0/100 | 0/100 | 1/100 | 22/100 |
| 12/12 | 0/100 | 0/100 | 0/100 | 0/100 | 0/100 | 0/100 | 0/100 | 17/100 |
| 15/15 | 0/100 | 0/100 | 0/100 | 0/100 | 0/100 | 0/100 | 0/100 | 8/100 |
| 20/20 | 0/100 | 0/100 | 0/100 | 0/100 | 0/100 | 0/100 | 0/100 | 0/100 |

TABLE 11

(Exp. 05: Short-Circuit Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 24/100 | 3/100 | 0/100 | 0/100 | 0/100 | 0/100 | 0/100 | 0/100 |
| 10/10 | 15/100 | 9/100 | 0/100 | 0/100 | 0/100 | 0/100 | 0/100 | 0/100 |
| 12/12 | 11/100 | 6/100 | 0/100 | 0/100 | 0/100 | 0/100 | 0/100 | 0/100 |
| 15/15 | 9/100 | 10/100 | 0/100 | 0/100 | 0/100 | 0/100 | 0/100 | 0/100 |
| 20/20 | 17/100 | 5/100 | 0/100 | 0/100 | 0/100 | 0/100 | 0/100 | 0/100 |

TABLE 12

(Exp. 06: Open Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 0/100 | 33/100 |
| 10/10 | 0/100 | 0/100 | 0/100 | 0/100 | 0/100 | 0/100 | 1/100 | 19/100 |
| 12/12 | 0/100 | 0/100 | 0/100 | 0/100 | 0/100 | 0/100 | 0/100 | 18/100 |
| 15/15 | 0/100 | 0/100 | 0/100 | 0/100 | 0/100 | 0/100 | 0/100 | 8/100 |
| 20/20 | 0/100 | 0/100 | 0/100 | 0/100 | 0/100 | 0/100 | 0/100 | 0/100 |

TABLE 13

(Exp. 06: Short-Circuit Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 8/100 | 6/100 | 0/100 | 0/100 | 0/100 | 0/100 | 0/100 | 0/100 |
| 10/10 | 10/100 | 7/100 | 0/100 | 0/100 | 0/100 | 0/100 | 0/100 | 0/100 |
| 12/12 | 13/100 | 4/100 | 0/100 | 0/100 | 0/100 | 0/100 | 0/100 | 0/100 |
| 15/15 | 14/100 | 5/100 | 0/100 | 0/100 | 0/100 | 0/100 | 0/100 | 0/100 |
| 20/20 | 11/100 | 6/100 | 0/100 | 0/100 | 0/100 | 0/100 | 0/100 | 0/100 |

TABLE 14

(Exp. 07: Open Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 0/100 | 38/100 |
| 10/10 | 0/100 | 0/100 | 0/100 | 0/100 | 0/100 | 0/100 | 0/100 | 20/100 |
| 12/12 | 0/100 | 0/100 | 0/100 | 0/100 | 0/100 | 0/100 | 0/100 | 18/100 |
| 15/15 | 0/100 | 0/100 | 0/100 | 0/100 | 0/100 | 0/100 | 0/100 | 7/100 |
| 20/20 | 0/100 | 0/100 | 0/100 | 0/100 | 0/100 | 0/100 | 0/100 | 0/100 |

TABLE 15

(Exp. 07: Short-Circuit Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 9/100 | 10/100 | 0/100 | 0/100 | 0/100 | 0/100 | 0/100 | 0/100 |
| 10/10 | 18/100 | 6/100 | 0/100 | 0/100 | 0/100 | 0/100 | 0/100 | 0/100 |
| 12/12 | 13/100 | 5/100 | 0/100 | 0/100 | 0/100 | 0/100 | 0/100 | 0/100 |
| 15/15 | 5/100 | 7/100 | 0/100 | 0/100 | 0/100 | 0/100 | 0/100 | 0/100 |
| 20/20 | 10/100 | 5/100 | 0/100 | 0/100 | 0/100 | 0/100 | 0/100 | 0/100 |

TABLE 16

(Exp. 08: Open Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 1/100 | 29/100 |
| 10/10 | 0/100 | 0/100 | 0/100 | 0/100 | 0/100 | 0/100 | 1/100 | 21/100 |
| 12/12 | 0/100 | 0/100 | 0/100 | 0/100 | 0/100 | 0/100 | 0/100 | 14/100 |
| 15/15 | 0/100 | 0/100 | 0/100 | 0/100 | 0/100 | 0/100 | 0/100 | 7/100 |
| 20/20 | 0/100 | 0/100 | 0/100 | 0/100 | 0/100 | 0/100 | 0/100 | 0/100 |

TABLE 17

(Exp. 08: Short-Circuit Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 14/100 | 5/100 | 0/100 | 0/100 | 0/100 | 0/100 | 0/100 | 0/100 |
| 10/10 | 10/100 | 7/100 | 0/100 | 0/100 | 0/100 | 0/100 | 0/100 | 0/100 |
| 12/12 | 16/100 | 10100 | 0/100 | 0/100 | 0/100 | 0/100 | 0/100 | 0/100 |
| 15/15 | 8/100 | 4/100 | 0/100 | 0/100 | 0/100 | 0/100 | 0/100 | 0/100 |
| 20/20 | 12/100 | 6/100 | 0/100 | 0/100 | 0/100 | 0/100 | 0/100 | 0/100 |

TABLE 18

(Exp. 09: Open Failure Rate)

| Wc/Dh [µm] | Dv [µm] | | | | | | | |
|---|---|---|---|---|---|---|---|---|
| | 3 | 4 | 5 | 10 | 15 | 20 | 25 | 30 |
| 5/5 | 0/100 | 0/100 | 0/100 | 0/100 | 0/100 | 0/100 | 1/100 | 44/100 |
| 10/10 | 0/100 | 0/100 | 0/100 | 0/100 | 0/100 | 0/100 | 1/100 | 21/100 |
| 12/12 | 0/100 | 0/100 | 0/100 | 0/100 | 0/100 | 0/100 | 1/100 | 22/100 |
| 15/15 | 0/100 | 0/100 | 0/100 | 0/100 | 0/100 | 0/100 | 0/100 | 10/100 |
| 20/20 | 0/100 | 0/100 | 0/100 | 0/100 | 0/100 | 0/100 | 0/100 | 0/100 |

TABLE 19

(Exp. 09: Short-Circuit Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 26/100 | 9/100 | 0/100 | 0/100 | 0/100 | 0/100 | 0/100 | 0/100 |
| 10/10 | 15/100 | 5/100 | 0/100 | 0/100 | 0/100 | 0/100 | 0/100 | 0/100 |
| 12/12 | 10/100 | 10/100 | 0/100 | 0/100 | 0/100 | 0/100 | 0/100 | 0/100 |
| 15/15 | 14/100 | 6/100 | 0/100 | 0/100 | 0/100 | 0/100 | 0/100 | 0/100 |
| 20/20 | 15/100 | 5/100 | 0/100 | 0/100 | 0/100 | 0/100 | 0/100 | 0/100 |

TABLE 20

(Exp. 10: Open Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 0/100 | 0/100 | 0/100 | 0/100 | 0/100 | 0/100 | 0/100 | 33/100 |
| 10/10 | 0/100 | 0/100 | 0/100 | 0/100 | 0/100 | 0/100 | 0/100 | 31/100 |
| 12/12 | 0/100 | 0/100 | 0/100 | 0/100 | 0/100 | 0/100 | 0/100 | 15/100 |
| 15/15 | 0/100 | 0/100 | 0/100 | 0/100 | 0/100 | 0/100 | 0/100 | 12/100 |
| 20/20 | 0/100 | 0/100 | 0/100 | 0/100 | 0/100 | 0/100 | 0/100 | 0/100 |

TABLE 21

(Exp. 10: Short-Circuit Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 18/100 | 10/100 | 0/100 | 0/100 | 0/100 | 0/100 | 0/100 | 0/100 |
| 10/10 | 17/100 | 10/100 | 0/100 | 0/100 | 0/100 | 0/100 | 0/100 | 0/100 |
| 12/12 | 10/100 | 7/100 | 0/100 | 0/100 | 0/100 | 0/100 | 0/100 | 0/100 |
| 15/15 | 13/100 | 6/100 | 0/100 | 0/100 | 0/100 | 0/100 | 0/100 | 0/100 |
| 20/20 | 16/100 | 8/100 | 0/100 | 0/100 | 0/100 | 0/100 | 0/100 | 0/100 |

TABLE 22

(Exp. 11: Open Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 0/100 | 0/100 | 0/100 | 0/100 | 0/100 | 0/100 | 1/100 | 46/100 |
| 10/10 | 0/100 | 0/100 | 0/100 | 0/100 | 0/100 | 0/100 | 1/100 | 19/100 |
| 12/12 | 0/100 | 0/100 | 0/100 | 0/100 | 0/100 | 0/100 | 0/100 | 18/100 |
| 15/15 | 0/100 | 0/100 | 0/100 | 0/100 | 0/100 | 0/100 | 0/100 | 6/100 |
| 20/20 | 0/100 | 0/100 | 0/100 | 0/100 | 0/100 | 0/100 | 0/100 | 0/100 |

TABLE 23

(Exp. 11: Short-Circuit Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 20/100 | 6/100 | 0/100 | 0/100 | 0/100 | 0/100 | 0/100 | 0/100 |
| 10/10 | 23/100 | 9/100 | 0/100 | 0/100 | 0/100 | 0/100 | 0/100 | 0/100 |
| 12/12 | 16/100 | 6/100 | 0/100 | 0/100 | 0/100 | 0/100 | 0/100 | 0/100 |
| 15/15 | 12/100 | 10/100 | 0/100 | 0/100 | 0/100 | 0/100 | 0/100 | 0/100 |
| 20/20 | 10/100 | 5/100 | 0/100 | 0/100 | 0/100 | 0/100 | 0/100 | 0/100 |

TABLE 24

(Exp. 12: Open Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 0/100 | 0/100 | 0/100 | 0/100 | 0/100 | 0/100 | 0/100 | 50/100 |
| 10/10 | 0/100 | 0/100 | 0/100 | 0/100 | 0/100 | 0/100 | 1/100 | 18/100 |
| 12/12 | 0/100 | 0/100 | 0/100 | 0/100 | 0/100 | 0/100 | 0/100 | 23/100 |
| 15/15 | 0/100 | 0/100 | 0/100 | 0/100 | 0/100 | 0/100 | 0/100 | 8/100 |
| 20/20 | 0/100 | 0/100 | 0/100 | 0/100 | 0/100 | 0/100 | 0/100 | 0/100 |

TABLE 25

(Exp. 12: Short-Circuit Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 12/100 | 7/100 | 0/100 | 0/100 | 0/100 | 0/100 | 0/100 | 0/100 |
| 10/10 | 15/100 | 5/100 | 0/100 | 0/100 | 0/100 | 0/100 | 0/100 | 0/100 |
| 12/12 | 20/100 | 5/100 | 0/100 | 0/100 | 0/100 | 0/100 | 0/100 | 0/100 |
| 15/15 | 16/100 | 9/100 | 0/100 | 0/100 | 0/100 | 0/100 | 0/100 | 0/100 |
| 20/20 | 12/100 | 5/100 | 0/100 | 0/100 | 0/100 | 0/100 | 0/100 | 0/100 |

TABLE 26

(Exp. 13: Open Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 0/100 | 0/100 | 0/100 | 0/100 | 0/100 | 0/100 | 1/100 | 24/100 |
| 10/10 | 0/100 | 0/100 | 0/100 | 0/100 | 0/100 | 0/100 | 0/100 | 30/100 |
| 12/12 | 0/100 | 0/100 | 0/100 | 0/100 | 0/100 | 0/100 | 0/100 | 16/100 |
| 15/15 | 0/100 | 0/100 | 0/100 | 0/100 | 0/100 | 0/100 | 0/100 | 8/100 |
| 20/20 | 0/100 | 0/100 | 0/100 | 0/100 | 0/100 | 0/100 | 0/100 | 0/100 |

TABLE 27

(Exp. 13: Short-Circuit Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 16/100 | 3/100 | 0/100 | 0/100 | 0/100 | 0/100 | 0/100 | 0/100 |
| 10/10 | 17/100 | 8/100 | 0/100 | 0/100 | 0/100 | 0/100 | 1/100 | 0/100 |
| 12/12 | 18/100 | 4/100 | 0/100 | 0/100 | 0/100 | 0/100 | 0/100 | 0/100 |
| 15/15 | 8/100 | 10/100 | 0/100 | 0/100 | 0/100 | 0/100 | 0/100 | 0/100 |
| 20/20 | 16/100 | 5/100 | 0/100 | 0/100 | 0/100 | 0/100 | 0/100 | 0/100 |

TABLE 28

(Exp. 14: Open Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 0/100 | 0/100 | 0/100 | 0/100 | 0/100 | 0/100 | 1/100 | 32/100 |
| 10/10 | 0/100 | 0/100 | 0/100 | 0/100 | 0/100 | 0/100 | 1/100 | 12/100 |
| 12/12 | 0/100 | 0/100 | 0/100 | 0/100 | 0/100 | 0/100 | 0/100 | 16/100 |
| 15/15 | 0/100 | 0/100 | 0/100 | 0/100 | 0/100 | 0/100 | 0/100 | 8/100 |
| 20/20 | 0/100 | 0/100 | 0/100 | 0/100 | 0/100 | 0/100 | 0/100 | 0/100 |

TABLE 29

(Exp. 14: Short-Circuit Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 22/100 | 9/100 | 0/100 | 0/100 | 0/100 | 0/100 | 0/100 | 0/100 |
| 10/10 | 15/100 | 3/100 | 0/100 | 0/100 | 0/100 | 0/100 | 0/100 | 0/100 |
| 12/12 | 10/100 | 10/100 | 0/100 | 0/100 | 0/100 | 0/100 | 0/100 | 0/100 |
| 15/15 | 8/100 | 8/100 | 0/100 | 0/100 | 0/100 | 0/100 | 0/100 | 0/100 |
| 20/20 | 16/100 | 4/100 | 0/100 | 0/100 | 0/100 | 0/100 | 0/100 | 0/100 |

TABLE 30

(Exp. 15: Open Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 0/100 | 0/100 | 0/100 | 0/100 | 0/100 | 0/100 | 1/100 | 40/100 |
| 10/10 | 0/100 | 0/100 | 0/100 | 0/100 | 0/100 | 0/100 | 1/100 | 16/100 |
| 12/12 | 0/100 | 0/100 | 0/100 | 0/100 | 0/100 | 0/100 | 0/100 | 18/100 |
| 15/15 | 0/100 | 0/100 | 0/100 | 0/100 | 0/100 | 0/100 | 0/100 | 7/100 |
| 20/20 | 0/100 | 0/100 | 0/100 | 0/100 | 0/100 | 0/100 | 0/100 | 0/100 |

TABLE 31

(Exp. 15: Short-Circuit Failure Rate)

| Wc/Dh | Dv [μm] | | | | | | | |
|---|---|---|---|---|---|---|---|---|
| [μm] | 3 | 4 | 5 | 10 | 15 | 20 | 25 | 30 |
| 5/5 | 20/100 | 8/100 | 0/100 | 0/100 | 0/100 | 0/100 | 0/100 | 0/100 |
| 10/10 | 9/100 | 7/100 | 0/100 | 0/100 | 0/100 | 0/100 | 0/100 | 0/100 |
| 12/12 | 16/100 | 10/100 | 0/100 | 0/100 | 0/100 | 0/100 | 0/100 | 0/100 |
| 15/15 | 13/100 | 8/100 | 0/100 | 0/100 | 0/100 | 0/100 | 0/100 | 0/100 |
| 20/20 | 14/100 | 7/100 | 0/100 | 0/100 | 0/100 | 0/100 | 0/100 | 0/100 |

As apparent from the data shown in the above-described Table 2 to 31, in the central portion of the sample boards for evaluation according to the present experimental example (corresponding to the region including the inner layer wiring corresponding to the previously mentioned fine-lined inplane wiring), a highly fine-lined inner layer wiring (corresponding to the previously mentioned fine-lined inplane wiring) is disposed, wherein the width of the inner layer wirings extending in respective planes of the first wiring layer and the second wiring layer (the dimension in a plane parallel to said principal surfaces of the inner layer wiring's cross-section surface perpendicular to its extending direction) (Wc) and the interval of the inner layer wirings adjacent in respective planes of the first wiring layer and the second wiring layer (Dh) are respectively 20 μm or less, more preferably 15 μm or less.

As apparent from the evaluation results on the open failure rates of the various sample boards for evaluation shown in the above-described Table 2 to 31, in the various sample boards for evaluation wherein the inner layer wirings highly fine-lined as described above are disposed, open failure rate (incidence rate of poor continuity in an inner layer wiring) can be remarkably decreased by making the thickness (dimension in the thickness direction of the sample board for evaluation) of the base material layer (dielectric layer) intervening the inner layer wiring included in the first wiring layer and the inner layer wiring included in the second wiring layer adjacent in the thickness direction of the board in the central portion of the board, namely the interval (Dv) in the thickness direction of the board of these adjacent inner layer wirings, 25 μm or less, more preferably 20 μm or less.

On the other hand, as apparent from the evaluation results on the short-circuit failure rates of the various sample boards for evaluation shown in the above-described Table 2 to 31, in the various sample boards for evaluation wherein the inner layer wirings highly fine-lined as described above are disposed, short-circuit failure rate (incidence rate of poor insulation in inner layer wirings) can be remarkably decreased by making the interval (Dv) in the thickness direction of the board of the above-described adjacent inner layer wirings more than 4 μm, more preferably 5 μm or more.

From the above, in accordance with the laminated and sintered ceramic circuit boards according to the present invention including the various embodiments described in the above example, a circuit board with high reliability against temperature alteration and high mechanical strength and low incidence rates of poor continuity and poor insulation in an inner layer wiring can be provided. Namely, in accordance with the laminated and sintered ceramic circuit boards according to the present invention, a board that can decrease thermal stress acting between a semiconductor element and a board in association with temperature alteration and has high mechanical strength (rigidity) as a whole board (including a multilayer wiring layer) and has remarkably low incidence rates of poor continuity and poor insulation in an inner layer wiring can be provided.

Although some embodiments with certain configurations have been described for the purpose of description of the present invention, it is not necessary to say that the scope of the present invention is not limited to these exemplary embodiments and modification can be properly added within the range of the matter described in the claims and specification.

REFERENCE SIGNS LIST

10: laminated and sintered ceramic circuit board, 11: base material, 12: first surface electrode, 13: second surface electrode, 14: inner layer wiring, 15: through conductor, 16: inplane conductor, and 17: fine-lined inplane wiring.

What is claimed is:

1. A laminated and sintered ceramic circuit board, which comprises:
   base material that comprises plural dielectric layers comprising ceramic,
   one or more first surface electrodes disposed to expose at a first principal surface that is one surface of two principal surfaces and comprising conductor,
   one or more second surface electrodes disposed to expose at a second principal surface that is the other surface of said two principal surfaces and comprising conductor, and
   an inner layer wiring embedded within said base material and comprising conductor;
   wherein said inner layer wiring electrically connects at least a portion of said first surface electrodes and at least a portion of said second surface electrodes,
   said inner layer wiring comprises a through conductor extending through at least one of said plural dielectric layers in a direction perpendicular to said principal surfaces and inplane conductors extending in plural planes parallel to said principal surfaces,
   at least a portion of said inplane conductors are configured as a fine-lined inplane wiring, where its cross-section surface perpendicular to its extending direction has dimension of 15 μm or less in a plane parallel to said principal surfaces, and the interval of said inplane conductors adjacent in a plane parallel to said principal surfaces is 15 μm or less, said dielectric layer(s) includes a region intervening two planes, where said two planes are parallel to said principal surfaces and include said inplane fine-lined conductor, said region does not include said inplane fine-lined conductor, and said region has dimension of more than 4 μm and 25 μm or less in a direction perpendicular to said principal surfaces.

2. The laminated and sintered ceramic circuit board according to claim 1, wherein:

said conductor comprises at least one metal selected from gold, silver and copper.

3. The laminated and sintered ceramic circuit board according to claim 2, wherein:

said conductor comprises copper, said ceramic can be sintered at temperature less than 1080° C.

4. The laminated and sintered ceramic circuit board according to claim 2, wherein:

said conductor comprises silver, said ceramic can be sintered at temperature less than 960° C.

5. A semiconductor package comprising a semiconductor element and a package board, wherein:

said semiconductor element and said package board are electrically connected through an intermediate board interposed between said semiconductor element and said package board, said intermediate board is a laminated and sintered ceramic circuit board, which comprises:

base material that comprises plural dielectric layers comprising ceramic, one or more first surface electrodes disposed to expose at a first principal surface that is one surface of two principal surfaces and comprising conductor, one or more second surface electrodes disposed to expose at a second principal surface that is the other surface of said two principal surfaces and comprising conductor, and an inner layer wiring embedded within said base material and comprising conductor;

wherein said inner layer wiring electrically connects at least a portion of said first surface electrodes and at least a portion of said second surface electrodes, said inner layer wiring comprises a through conductor extending through at least one of said plural dielectric layers in a direction perpendicular to said principal surfaces and inplane conductors extending in plural planes parallel to said principal surfaces, at least a portion of said inplane conductors are configured as a fine-lined inplane wiring, where its cross-section surface perpendicular to its extending direction has dimension of 15 μm or less in a plane parallel to said principal surfaces, and the interval of said inplane conductors adjacent in a plane parallel to said principal surfaces is 15 μm or less, said dielectric layer(s) includes a region intervening two planes, where said two planes are parallel to said principal surfaces and include said inplane fine-lined conductor, said region does not include said inplane fine-lined conductor, and said region has dimension of more than 4 μm and 25 μm or less in a direction perpendicular to said principal surfaces.

6. The semiconductor package according to claim 5, wherein:

said semiconductor element is a semiconductor IC chip.

7. The semiconductor package according to claim 5, wherein:

base material of said package board comprises resin.

8. The semiconductor package according to claims 5, wherein:

said conductor comprises at least one metal selected from gold, silver and copper.

9. The semiconductor package according to claim 8, wherein:

said conductor comprises copper, said ceramic can be sintered at temperature less than 1080° C.

10. The semiconductor package according to claim 8, wherein:

said conductor comprises silver, said ceramic can be sintered at temperature less than 960° C.

11. The semiconductor package according to claim 6, wherein:

base material of said package board comprises resin.

12. The semiconductor package according to claim 6, wherein:

said conductor comprises at least one metal selected from gold, silver and copper.

13. The semiconductor package according to claim 7, wherein:

said conductor comprises at least one metal selected from gold, silver and copper.

* * * * *